(12) United States Patent
Jereza et al.

(10) Patent No.: US 8,222,718 B2
(45) Date of Patent: Jul. 17, 2012

(54) SEMICONDUCTOR DIE PACKAGE AND METHOD FOR MAKING THE SAME

(75) Inventors: Armand Vincent C. Jereza, Cebu (PH); Paul Armand Calo, Lapu-Lapu (PH); Erwin Victor R. Cruz, Koronadal (HK)

(73) Assignee: Fairchild Semiconductor Corporation, South Portland, ME (US)

( * ) Notice: Subject to any disclaimer, the term of this patent is extended or adjusted under 35 U.S.C. 154(b) by 170 days.

(21) Appl. No.: 12/366,039

(22) Filed: Feb. 5, 2009

(65) Prior Publication Data

US 2010/0193921 A1    Aug. 5, 2010

(51) Int. Cl.
 *H01L 23/495*    (2006.01)
(52) U.S. Cl. .................. 257/676; 257/E23.141
(58) Field of Classification Search .......... 257/676, 257/E23.141
See application file for complete search history.

(56) References Cited

U.S. PATENT DOCUMENTS

| | | | |
|---|---|---|---|
| 5,327,325 A | 7/1994 | Nicewarner, Jr. | |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,432,750 B2 | 8/2002 | Jeon et al. | |
| 6,460,245 B1 * | 10/2002 | DiStefano | 29/840 |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,731,003 B2 | 5/2004 | Joshi et al. | |
| 6,740,541 B2 | 5/2004 | Rajeev | |
| 6,756,689 B2 | 6/2004 | Nam et al. | |
| 6,774,465 B2 | 8/2004 | Lee et al. | |
| 6,777,800 B2 | 8/2004 | Madrid et al. | |
| 6,806,580 B2 | 10/2004 | Joshi et al. | |
| 6,830,959 B2 | 12/2004 | Estacio | |
| 6,836,023 B2 | 12/2004 | Joshi et al. | |
| 6,861,286 B2 | 3/2005 | Estacio et al. | |
| 6,867,481 B2 | 3/2005 | Joshi et al. | |
| 6,867,489 B1 | 3/2005 | Estacio | |
| 6,891,256 B2 | 5/2005 | Joshi et al. | |
| 6,891,257 B2 | 5/2005 | Chong et al. | |
| 6,893,901 B2 | 5/2005 | Madrid | |

(Continued)

FOREIGN PATENT DOCUMENTS

JP    60-217649 A    10/1985

(Continued)

*Primary Examiner* — Bradley K Smith
*Assistant Examiner* — Mohammad T Karimy
(74) *Attorney, Agent, or Firm* — Hiscock & Barclay, LLP (57) ABSTRACT

A semiconductor die package. The semiconductor die package includes a premolded clip structure assembly having a clip structure, a semiconductor die attached to the clip structure, and a first molding material covering at least a portion of the clip structure and the semiconductor die. The semiconductor die package also includes a leadframe structure having a die attach pad, where the leadframe structure is attached to premolded clip structure assembly.

17 Claims, 12 Drawing Sheets

U.S. PATENT DOCUMENTS

| | | |
|---|---|---|
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 * | 10/2007 | Cruz et al. ............ 257/690 |
| 7,315,077 B2 | 1/2008 | Choi et al. |
| 7,332,806 B2 | 2/2008 | Joshi et al. |
| 7,368,325 B2 | 5/2008 | Standing |
| 7,371,616 B2 | 5/2008 | Jereza |
| 7,439,613 B2 | 10/2008 | Joshi et al. |
| 7,501,702 B2 | 3/2009 | Joshi et al. |
| 7,504,281 B2 | 3/2009 | Joshi |
| 2007/0001278 A1 * | 1/2007 | Jeon et al. ............ 257/676 |
| 2007/0114352 A1 | 5/2007 | Cruz et al. |
| 2007/0155058 A1 * | 7/2007 | Jereza ............ 438/123 |
| 2009/0057869 A1 * | 3/2009 | Hebert et al. ............ 257/691 |
| 2010/0176508 A1 * | 7/2010 | Herbsommer et al. ....... 257/718 |

FOREIGN PATENT DOCUMENTS

| | | |
|---|---|---|
| JP | 2005-277168 A | 10/2005 |

* cited by examiner

SEMICONDUCTOR DIE PACKAGE AND METHOD FOR MAKING THE SAME

CROSS-REFERENCES TO RELATED APPLICATIONS

Not Applicable

BACKGROUND

Semiconductor die packages are known in the semiconductor industry, but could be improved. For example, electronic devices such as wireless phones and the like are becoming smaller and smaller. It is desirable to make smaller semiconductor die packages, so that they can be incorporated into such electronic devices. However, smaller packages often require smaller semiconductor dies. This can impact performance and increase contact resistance. It would also be desirable to improve upon the heat dissipation properties of conventional semiconductor die packages. Semiconductor die packages including power transistors, for example, generate a significant amount of heat. It would also be desirable to provide end users of such semiconductor die packages with robust interconnection options.

Figure 8A:
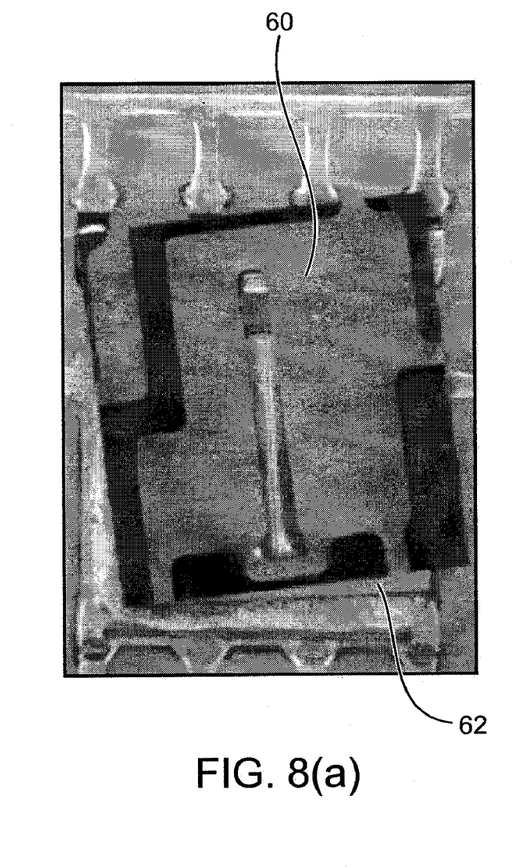
FIGS. 8(a) and 8(b) show images of premolded clips as they are mounted on a semiconductor die using a conventional process.
Figure 8B:
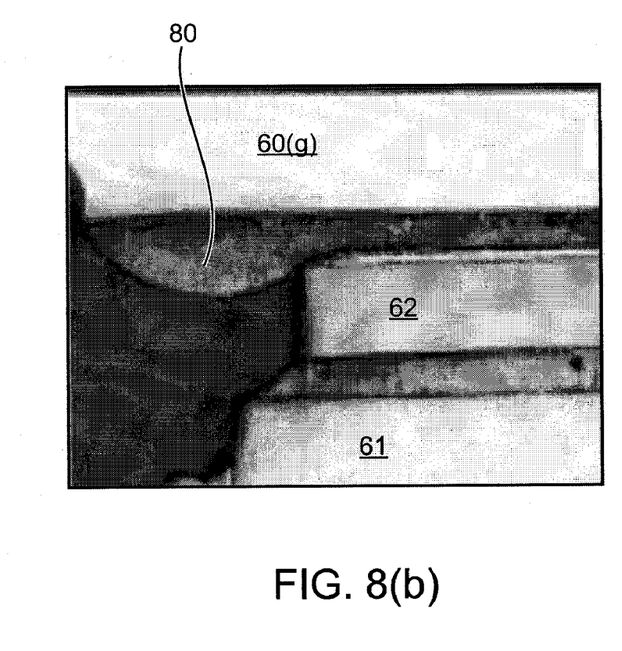

Some semiconductor die packages have premolded clip structures. A premolded clip structure can include a molding material and a clip structure. A premolded clip structure such as this can be attached to a semiconductor die using a first solder material, and the semiconductor die can be attached to a leadframe structure using a second solder material. When the first and second solder materials are reflowed during the process of manufacture of the semiconductor die package, they can shift with respect to each other. This can undesirably cause the premolded clip structure 60 to rotate with respect to the leadframe structure and/or the semiconductor die 62 as shown in FIG. 8(a). Also, as shown in FIG. 8(b), in the prior method for forming a semiconductor die package with a premolded clip structure, the volume of the solder paste is also difficult to control when solder is placed on a small gate pad, thereby causing the gate solder to overflow to the corner of the semiconductor die. FIG. 8(b) shows solder 80 which overflows over the edge of the semiconductor die 62. The solder 80 contacts a portion of a gate clip structure 60(g) in the premolded clip structure 60. As shown in FIG. 8(b), the leadframe structure 61 is shown and supports the semiconductor die 62.

Embodiments of the invention address these and other problems, individually and collectively.

BRIEF SUMMARY

Embodiments of the invention are directed towards semiconductor die packages and their methods of manufacture.

One embodiment of the invention is directed to a semiconductor die package including a premolded clip structure assembly having a clip structure, a semiconductor die attached to the clip structure and a first molding material covering at least a portion of the clip structure and the semiconductor die. The semiconductor die package also includes a leadframe structure having a die attach pad, where the leadframe structure is attached to premolded clip structure assembly.

Another embodiment of the invention is directed to a method comprising: obtaining a leadframe structure; and attaching a premolded clip structure assembly comprising a clip structure, a semiconductor die attached to the clip structure, and a first molding material covering at least a portion of the clip structure and the semiconductor die, to the leadframe structure.

Another embodiment of the invention is directed to a semiconductor die package comprising: a leadframe structure comprising a leadframe structure surface; a semiconductor die attached to the leadframe structure, wherein the semiconductor die comprises a first surface comprising an input region and a second surface comprising an output region; a molding material covering at least a portion of the semiconductor die and the leadframe structure, wherein the molding material exposes the second surface of the semiconductor die and also exposes the leadframe structure surface; a metallic housing structure comprising a major portion and a first leg extending from the major portion and a second leg extending from the major portion and opposite the first leg, wherein the metallic housing is electrically and mechanically coupled to the output region at the second surface of the semiconductor die; and a conductive adhesive coupling the major portion of the metallic housing structure and the second surface of the semiconductor die.

Another embodiment of the invention is directed to a method comprising: attaching a semiconductor die to a leadframe structure comprising a leadframe structure surface, wherein the semiconductor die comprises a first surface comprising an input region and a second surface comprising an output region; molding a molding material around at least a portion of the semiconductor die and the leadframe structure, wherein the molding material exposes the second surface of the semiconductor die and also exposes the leadframe structure surface; and attaching a metallic housing structure comprising a major portion and a first leg extending from the major portion and a second leg extending from the major portion opposite the first leg, to the semiconductor die, wherein the output region at the second surface is electrically and mechanically coupled to the metallic housing structure.

Other embodiments of the invention are directed to electrical assemblies and systems that can incorporate the semiconductor die packages according to embodiments of the invention.

These and other embodiments of the invention are described in detail in the Detailed Description with reference to the Figures. In the Figures, like numerals may reference like elements and descriptions of some elements may not be repeated. In addition, in the Figures, some elements may not be drawn to scale.

BRIEF DESCRIPTION OF THE DRAWINGS

In the Figures, like numerals designate like elements and descriptions of similar elements may not be repeated. Further details regarding embodiments of the invention are provided in the Detailed Description with reference to the Figures.

DETAILED DESCRIPTION

I. Semiconductor Die Packages Including Premolded Clip Assemblies

Figure 1:
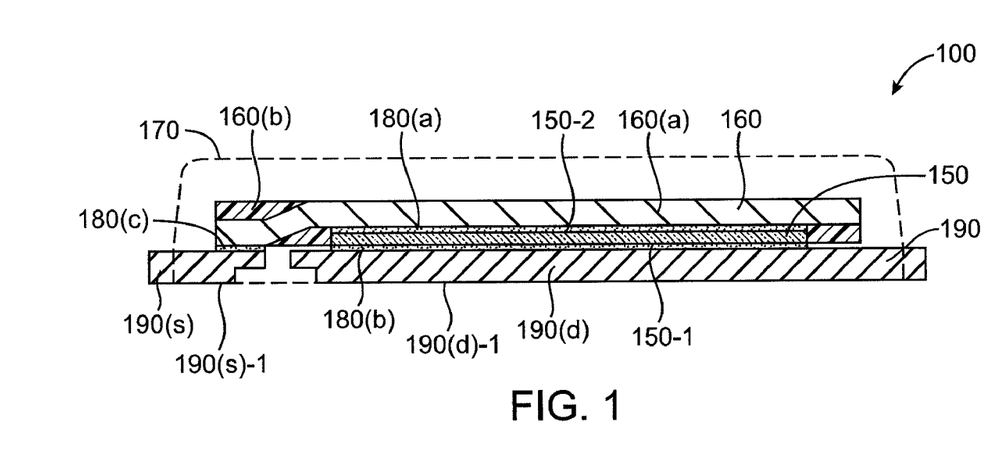
FIG. 1 shows a side, cross-sectional view of a semiconductor die package according to an embodiment of the invention.
Figure 2:
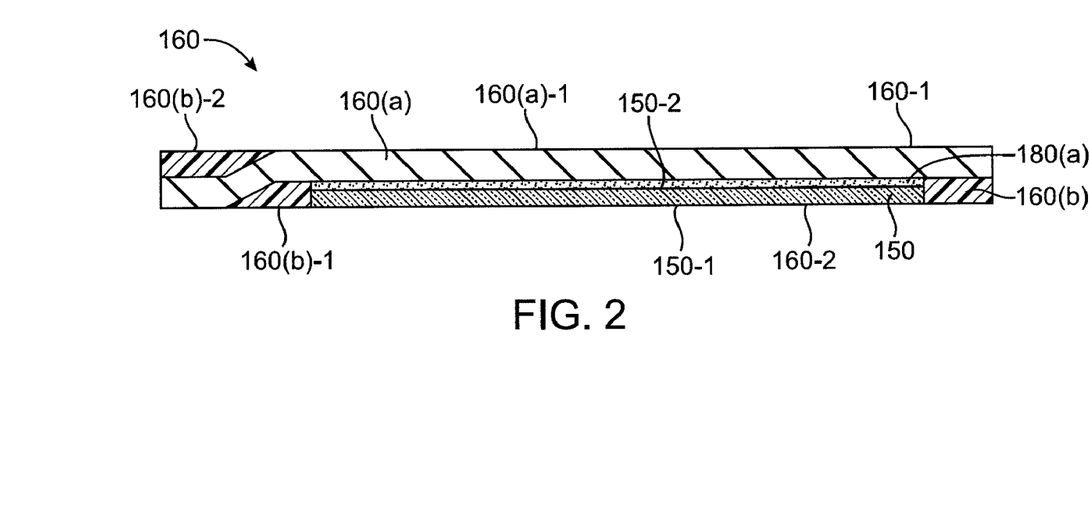
FIG. 2 shows a side, cross-sectional view of a premolded clip structure assembly according to an embodiment of the invention.

FIG. 1 shows a side, cross-sectional view of a semiconductor die package 100 according to an embodiment of the invention. FIG. 2 shows a side, cross-sectional view of a premolded clip structure assembly according to an embodiment of the invention.

The semiconductor die package 100 comprises a premolded clip structure assembly 160 comprising a clip structure 160(a), and a semiconductor die 150 attached to the clip structure 160(a) using a first conductive adhesive 180(a). The semiconductor die 150 includes a first major surface 150-1 and a second major surface 150-2 opposite to the first major surface 150-1. The first conductive adhesive 180(a) is in contact with a second surface 150-2 of the semiconductor die 150. The first surface 150-1 may comprise an output region such as a drain region, while the second major surface 150-2 may comprise an input region such as a source region and a gate region.

A first molding material 160(b), such as an epoxy molding material, covers at least a portion of the clip structure 160(a) and the semiconductor die 150. As shown in FIG. 2, the first molding material 160(b) has a first surface 160(b)-1 which is substantially coplanar with the first surface 150-1 of the semiconductor die 150. A second surface 160(b)-2 of the first molding material 160(b) may also be substantially coplanar with a top surface 160(a)-1 of the clip structure 160(a). The top surface 160(a)-1 of the clip structure 160(a) and the second surface 160(b)-2 of the first molding material 160(b) may form a first surface 160-1 of the premolded clip structure assembly 160. A second surface 160-2 of the premolded clip structure assembly 160 is opposite to the first surface 160-1. The second surface 160-2 of the premolded clip structure assembly 160 comprises at least the first molding material surface 160(b)-1 and the first surface 150-1 of the semiconductor die 150.

Referring to FIG. 1, the semiconductor die package 100 also comprises a leadframe structure 190 comprising a die attach pad. The leadframe structure 190 is attached to premolded clip structure assembly 160 using a second conductive adhesive 180(b) and a third conductive adhesive 180(c).

The leadframe structure 190 may comprise a number of different portions including a drain lead structure 190(d), which may include a die attach pad as well as a number of leads extending from the die attach pad. It may also comprise a source lead structure 190(s) and a gate lead structure (not shown in FIG. 1) which may be electrically isolated from the source lead structure 190(s).

The first, second, and third conductive adhesives 180(a), 180(b), 180(c) that are described above may comprise any suitable conductive adhesive material. Examples include conductive epoxies, as well as solder (e.g., Pb-based or Pb-free solder). In some embodiments, the first conductive adhesive 180(a) may have a higher melting temperature than the second and third conductive adhesives 180(b), 180(c), since the premolded clip structure assembly 160 is formed before it is attached to the leadframe structure 190.

A second molding material 170 (e.g., an epoxy molding material), which is shown by a dotted line, covers at least a portion of the premolded clip structure assembly 160 as well as a portion of the leadframe structure 190. As shown in FIG. 1, a bottom exterior surface of the second molding material 170 may be substantially coplanar with exterior surfaces of the leadframe structure 190 including a source lead structure surface 190(s)-1 and a drain lead structure surface 190(d)-1. The source lead structure surface 190(s)-1 and the drain lead structure surface 190(d)-1 may be in contact with yet another conductive adhesive, when it is mounted to an underlying circuit board (not shown) or the like.

The second molding material 170 may be the same or different than the first molding material 160(b). Since they are formed at different times, there can be an interface between the first and second molding materials 160(b), 170 in the semiconductor die package 100.

The semiconductor die 150 in this and in the other embodiments described in this application may include any suitable semiconductor device (such as a p-channel MOSFET die or an n-channel MOSFET die), and can be a vertical device. Vertical devices have at least an input at one side of the die and an output at the other side of the die so that current can flow vertically through the die.

Examples of some vertical devices, in certain implementations, include vertical power MOSFETs, vertical diodes, VDMOS transistors, vertical bipolar transistors, etc. Suitable semiconductors include silicon, gallium-arsenide, and other so called "III-V" and "II-VI" semiconductor materials. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures can be narrower and occupy less space than planar gate structures.

Figure 15:
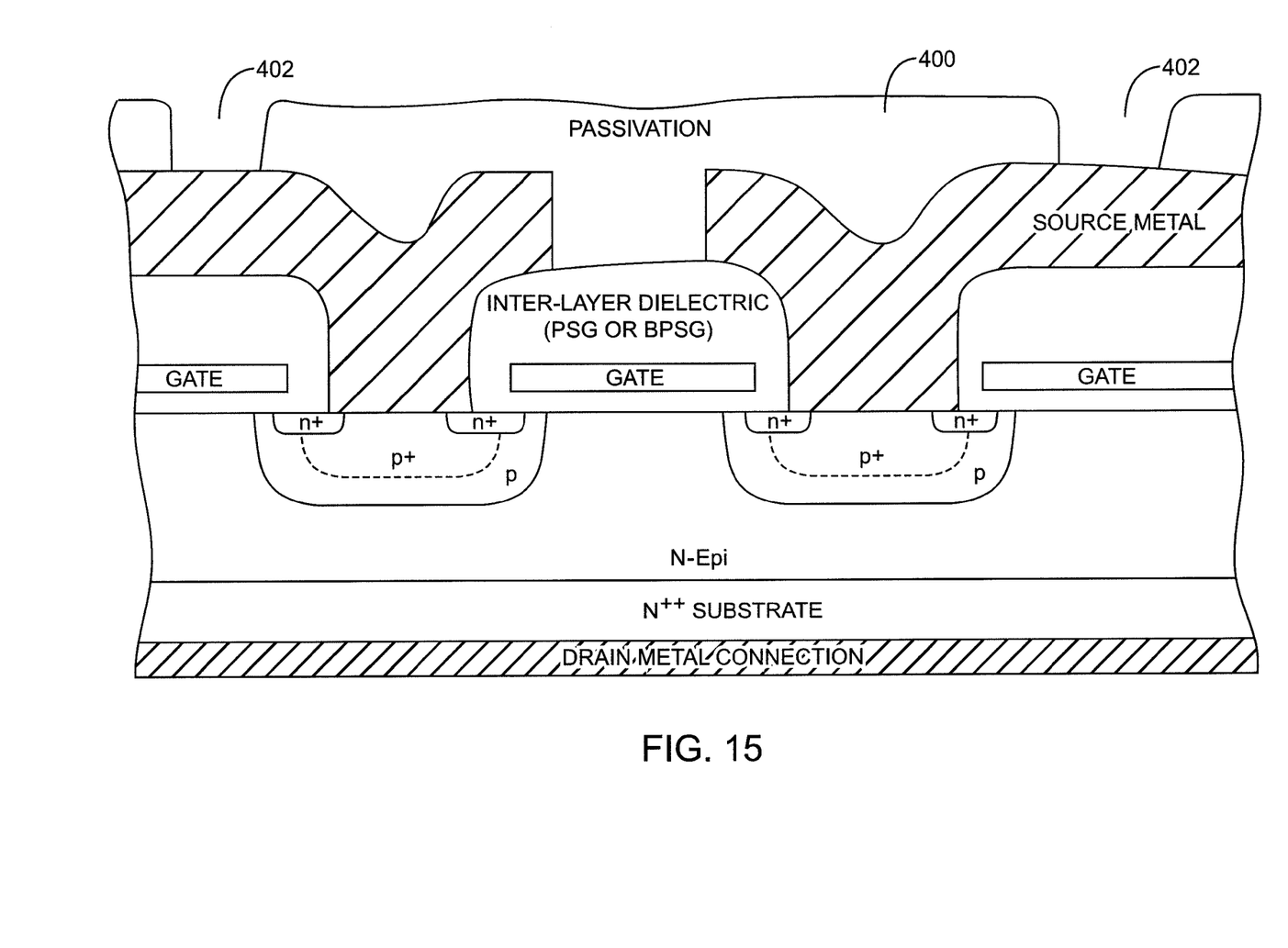
FIG. 15 shows a cross-sectional view of a vertical power MOSFET that can be used in the semiconductor die packages according to embodiments of the invention.

During operation, the current flow from the source region to the drain region in a VDMOS device is substantially perpendicular to the die surfaces. An example of vertical power MOSFET is shown in FIG. 15.

Figure 3:
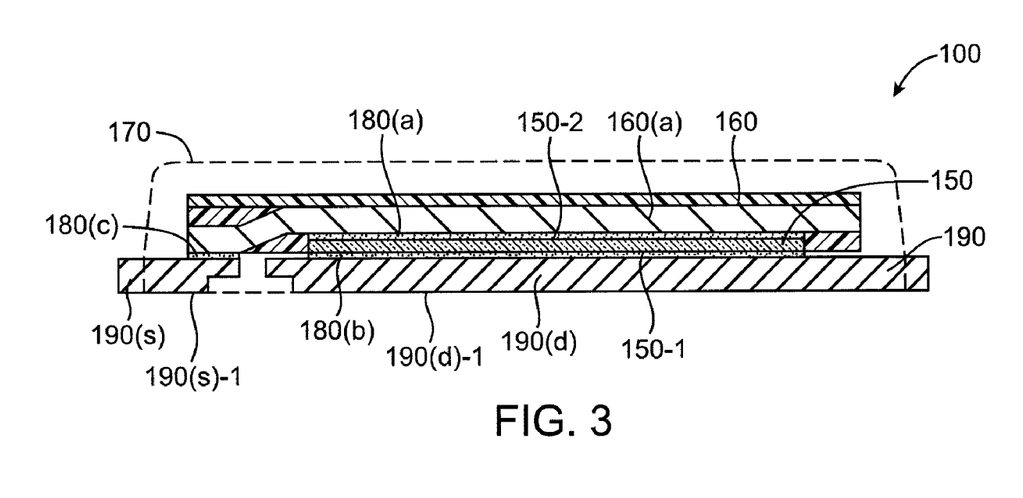
FIG. 3 shows a side, cross-sectional view of a semiconductor die package according to another embodiment of the invention.
Figure 4:
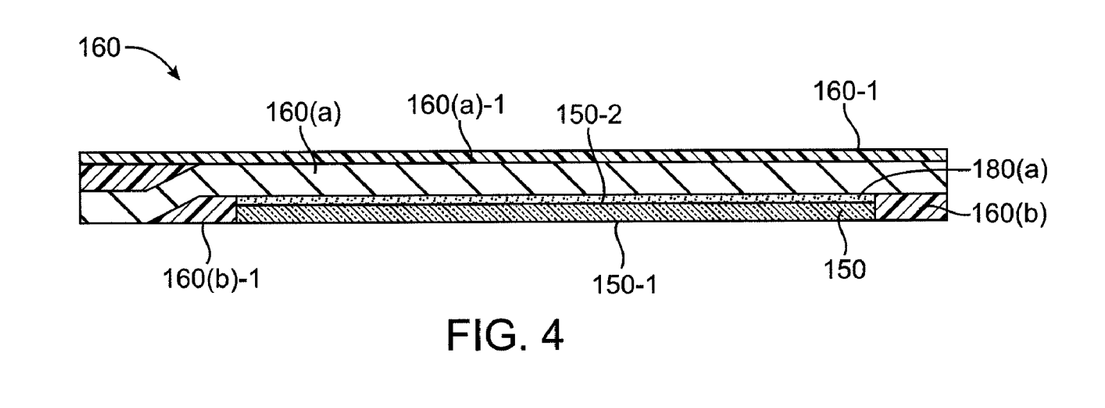
FIG. 4 shows a side, cross-sectional view of a premolded clip structure assembly according to another embodiment of the invention.

FIG. 3 shows a side, cross-sectional view of a semiconductor die package 100 according to another embodiment of the invention. FIG. 4 shows a side, cross-sectional view of a premolded clip structure assembly according to another embodiment of the invention.

The semiconductor die package in FIG. 3 is similar to the semiconductor die package shown in FIG. 1. Also, the premolded clip structure assembly 160 in FIG. 4 is similar to the clip structure assembly shown in FIG. 2. However, in the embodiments shown in FIGS. 3-4, the first molding material 160(b) covers the surface 160(a)-1 of the clip structure 160(a).

Figure 5:
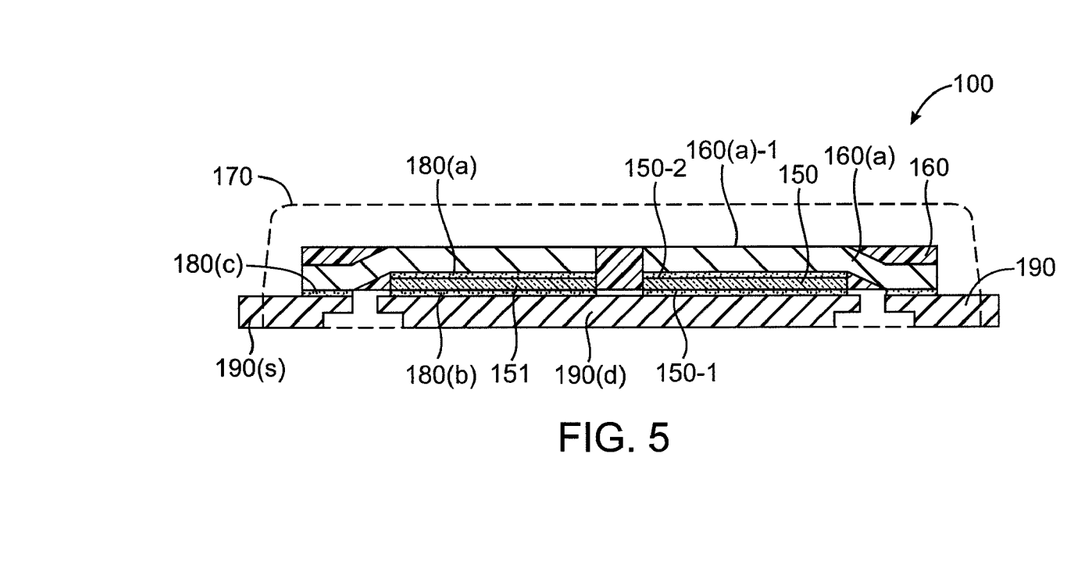
FIG. 5 shows a side, cross-sectional view of a semiconductor die package according to another embodiment of the invention.
Figure 6:
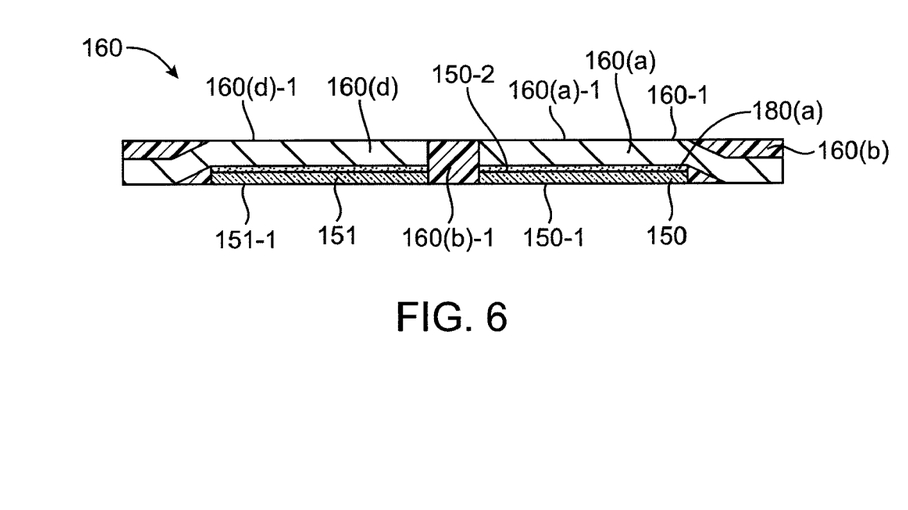
FIG. 6 shows a side, cross-sectional view of a premolded clip structure assembly according to another embodiment of the invention.

FIG. 5 shows a side, cross-sectional view of another semiconductor die package 100 according to another embodiment of the invention. FIG. 6 shows a side, cross-sectional view of a premolded clip assembly structure according to another embodiment of the invention.

The semiconductor die package shown in FIG. 5 is similar to the semiconductor die package shown in FIG. 1. Also, the premolded clip structure assembly 160 in FIG. 6 is similar to the premolded clip structure assembly shown in FIG. 2. However, in the embodiments shown in FIGS. 5-6, the premolded clip structure assembly 160 includes a first clip structure 160(a) attached to a first semiconductor die 150 and a second clip structure 160(d) attached to a second semiconductor die 151. Thus, the semiconductor die package 100 and the premolded clip structure assembly 160 each include two semiconductor dies and two clip structures. Although they include four semiconductor dies and two clip structures, embodiments of the invention may include packages and assemblies with more or less semiconductor dies and clip structures.

In the semiconductor die package 100, a molding material region 160(b)-1 separates the first clip structure 160(a) and the second clip structure 160(d) in the semiconductor die package 100. Also, a bottom surface of the molding material 160(b) may be substantially coplanar with semiconductor die surfaces 150-1 and 151-1.

Other embodiments of the invention are directed to methods for forming semiconductor die packages. In one embodiment of the invention, the method includes obtaining a leadframe structure, and attaching a premolded clip structure assembly to the leadframe structure. The premolded clip structure assembly comprises a clip structure, a semiconductor die attached to the clip structure, and a first molding material covering at least a portion of the clip structure and the semiconductor die. Exemplary methods for forming semiconductor die packages according to embodiments of the invention can be described with reference to FIGS. 7(a)-7(h).

Embodiments of the invention may include forming a premolded clip structure assembly. The process for forming the premolded clip structure assembly may include obtaining a clip structure, attaching a semiconductor die to the clip structure using a conductive adhesive, and molding the first molding material around at least the portion of the clip structure and the semiconductor die.

Figure 7A:
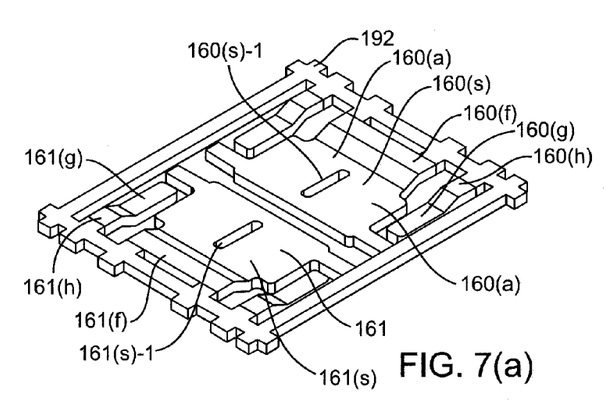
FIGS. 7(a)-7(g) show various precursors that are formed during the formation of a semiconductor die package according to an embodiment of the invention.

In the formation of a premolded clip structure assembly, a clip structure, such as the clip structure 160(a) shown in FIG. 7(a), may first be obtained. In FIG. 7(a), two clip structures 160(a), 161 are illustrated and are coupled together with a frame 192. The two clip structures 160(a), 161 can be used to form a semiconductor die package including two clip structures 160(a), 161 and two semiconductor dies mounted on each of the clip structures 160(a), 161.

The clip structures 160(a), 161 may have any suitable configuration or thickness (e.g., 1 mm or less). In this example, the clip structure 160(a) includes a major portion 160(s), which may be a source portion comprising a slot 160(s)-1, which may be used as a mold locking feature. A gate portion 160(g) is also present in the clip structure 160(a) and may be electrically isolated from the major portion 160(s) in the produced semiconductor die package. The clip structure 161 also includes a major portion 161(s) comprising a slot 161(s)-1 (which may also serve as a source terminal). A gate portion 161(g) is also present in the clip structure 161 and may be electrically isolated from the major portion 161(s) in the produced semiconductor die package. In addition, the clip structures 160(a), 161 may also have foot portions (e.g., 160(f), 161(f), 160(h), 161(h)), which are raised with respect to each of the major portions 160(s), 161(s) and the gate portions 160(g), 161(g).

The clip structures 160(a), 161 may comprise any suitable material. For example, conductive materials such as copper, aluminum, and noble metals (and alloys thereof) may be used in the clip structures 160(a), 161. The clip structures 160(a), 161 may also be plated with solderable layers, if desired.

The clip structures 160(a), 161 may also be formed in any suitable manner including etching, stamping, etc.

Figure 7B:
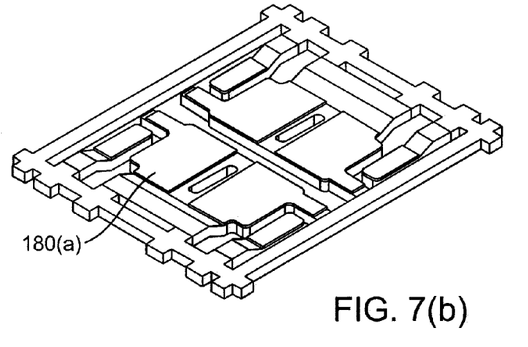

As shown in FIG. 7(b), after the clip structures 160(a), 161 are obtained, a first conductive adhesive 180(a) such as solder may be deposited on the major portions 160(s), 161(s) of the clip structures 160(a), 161, and portions of the gate portions 160(g), 161(g), while leaving raised foot portions 160(f), 161(f), 160(h), 161(h) of the clip structures 160(a), 161 bare. Any suitable solder deposition process may be used.

Figure 7C:
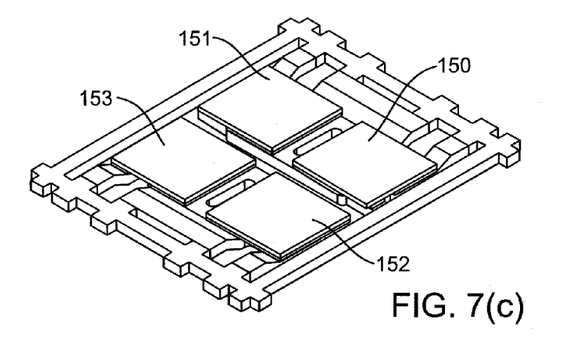

As shown in FIG. 7(c), first and second semiconductor dies 150, 151 are mounted on the first clip structure 160(a), while third and fourth semiconductor dies 152, 153 are mounted on the second clip structure 161. In this embodiment, the semiconductor dies 150, 151, 152, 153 may each comprise vertical power MOSFETs.

Figure 7D:
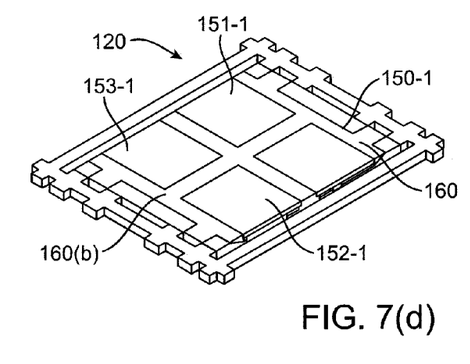

As shown in FIG. 7(d), after the semiconductor dies 150, 151, 152, 153, are mounted on the clip structures 160(a), 161, a first molding material 160(b) is formed around at least portions of the clip structures 160(a), 161 and the semiconductor dies 150, 151, 152, 153 to form a premolded clip structure assembly 160. As shown, first surfaces 150-1, 151-1, 152-1, 153-1 of the semiconductor dies 150, 151, 152, 153 are exposed through the first molding material 160(b) and they are substantially coplanar with an exterior surface of the second molding material 160(b).

Any suitable molding process can be used. Suitable molding processes may include tape assisted molding processes or injection molding processes. Suitable process considerations may be determined by those or ordinary skill in the art.

Figure 7E:
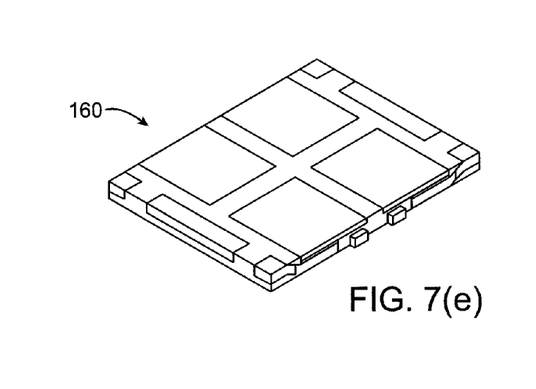

After molding, a singulation process can be performed. FIG. 7(e) shows the premolded clip structure assembly 160 without the previously described frame 192.

Figure 7F:
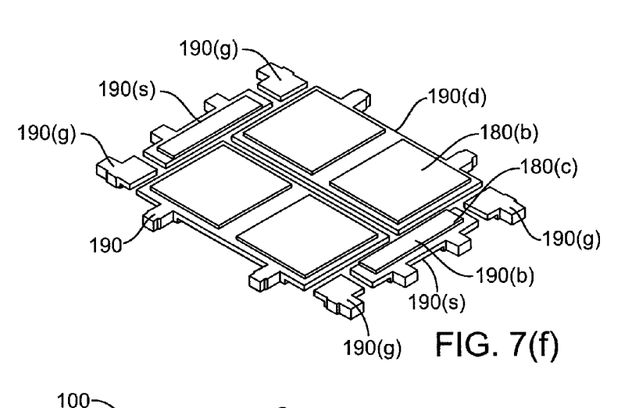
Figure 7G:
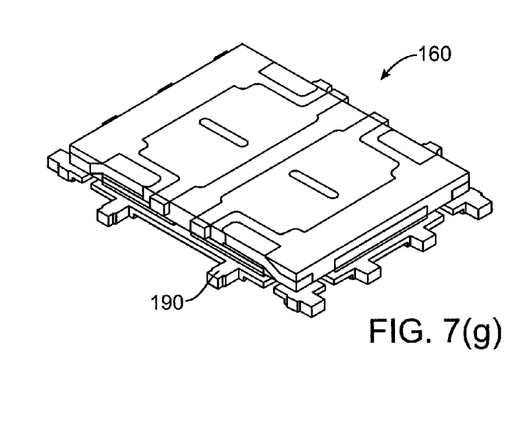
Figure 7H:
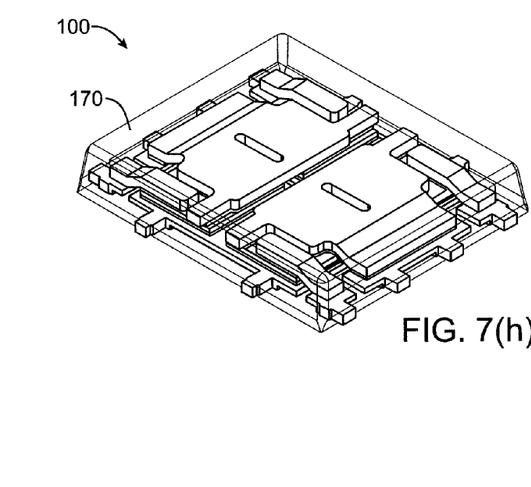
FIG. 7(h) shows a to perspective view of a semiconductor die package according to an embodiment of the invention.

Referring to FIG. 7(f), before or after the premolded clip structure assembly 160 is formed, a leadframe structure 190 is obtained. The leadframe structure may be obtained in any suitable manner. For example, the leadframe structure 190 can be stamped, etched and/or patterned using conventional processes to shape the leads or other portions of the leadframe structure. For example, the leadframe structure 190 can be formed by etching a continuous conductive sheet to form a predetermined pattern. If stamping is used, the leadframe structure may be one of many leadframe structures in an array of leadframe structures that are connected by tie-bars. The leadframe structure array may also be cut to separate the leadframe structures from other leadframe structures. The leadframe structure 190 may be a continuous metallic structure or a discontinuous metallic structure.

The term "leadframe structure" can refer to a structure that is derived from or is the same as a leadframe. Each leadframe structure can include one or more leads with lead surfaces and a die attach region. The leads and extend laterally from the die attach region.

The leadframe structure 190 may comprise any suitable material and may have any suitable characteristics. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness as known to one skilled in the art. The leadframe structure 190 may also have any suitable thickness, including a thickness less than about 1 mm (e.g., less than about 0.5 mm).

In FIG. 7(*f*), the leadframe structure 190 includes a number of gate lead structures 190(*g*), source lead structures 190(*s*), and drain lead structures 190(*d*). They can be electrically coupled to gate, source, and drain regions in the one or more semiconductor dies in the formed semiconductor die package. As shown in FIG. 7(*f*), a second conductive adhesive 180(*b*) is deposited on the drain lead structure 190(*d*), and a third conductive adhesive 180(*c*) is deposited on the source lead structure 190(*s*).

As shown in FIG. 7(*g*), after the leadframe structure 190 is coated with solder, the previously formed premolded clip structure assembly 160 is thereafter flipped over and is mounted on the leadframe structure 190 and is electrically coupled to the leadframe structure 190 using at least the second and third conductive adhesives 180(*b*), 180(*c*).

Referring to FIG. 7(*h*), a second molding material 170 is then formed around the premolded clip structure assembly 160 and the leadframe structure 190 to form the semiconductor die package 100. Any suitable molding and subsequent singulation process may be used.

Although the formation of one semiconductor die package is shown in FIGS. 7(*a*)-7(*h*), it is understood that an array of semiconductor die packages may be formed simultaneously in embodiments of the invention.

Embodiments of the invention may be used to form PQFN (power quad flat no lead), MLP (micro leadframe package), and other types of packages.

Embodiments of the invention provide a number of advantages. For example, because the premolded clip structure assembly includes the semiconductor die, the semiconductor die is aligned with the clip structure before the semiconductor die is mounted to the leadframe structure. The premolded clip structure assembly can then be aligned with respect to the leadframe structure when it is attached to it. Because the solder material connecting the semiconductor die to the clip structure and the solder material connecting the leadframe structure to the semiconductor die are not reflowed at the same time, the clip rotation and solder overhang problems shown in FIGS. 8(*a*) and 8(*b*) are less likely to occur. In addition, since the final assembly of the semiconductor die package is less likely to have defects, the number of reworked semiconductor die packages is decreased. In addition, the formed semiconductor die package is compact and has good heat dissipation properties.

II. Semiconductor Die Packages Including Metallic Housings

Other embodiments of the invention are directed to semiconductor die packages with improved heat dissipation capabilities. Embodiments of the invention can be used with common land patterns for common semiconductor packages and can have good top and bottom cooling properties, while providing good protection for the semiconductor die.

One embodiment of the invention is directed to a semiconductor die package having a semiconductor die such as a silicon die. It is attached to a leadframe structure with gate and source portions. The attachment of the silicon die to the leadframe structure is provided by solder, which is on the gate and source portions of the leadframe structure. The silicon die and leadframe structure is molded with surfaces of the gate and source portions of the leadframe structure exposed through the molding material. The backside of the semiconductor die is also exposed through the molding material. The molded leadframe structure and silicon die is then attached to a metallic housing such as a copper housing. Attachment of the copper housing to the molded leadframe structure and silicon die is provided by the solder which is on the exposed silicon backside. The copper housing provides a drain connection for the semiconductor die package and allows for cooling of the package through the top of the semiconductor die package.

Figure 9:
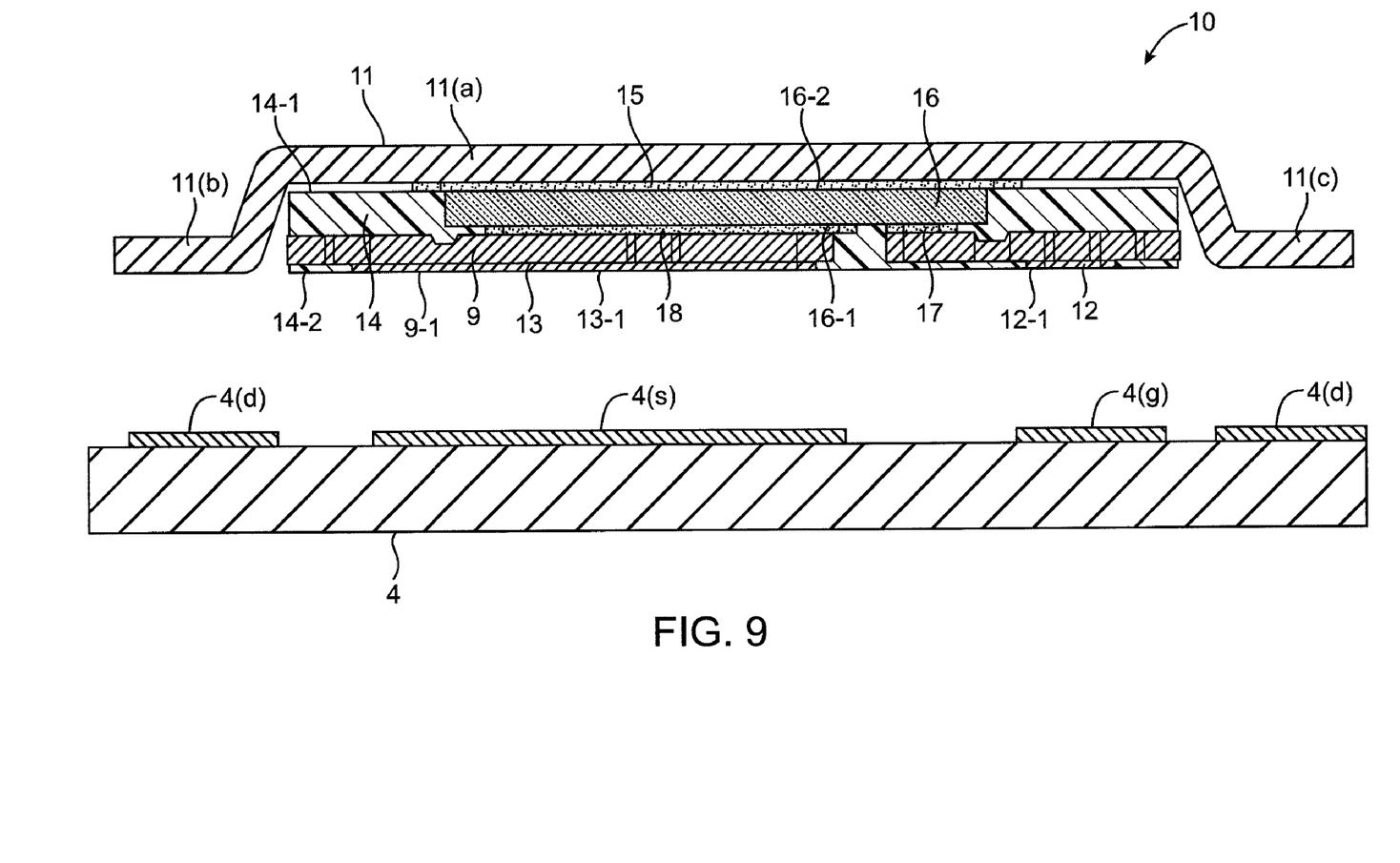
FIG. 9 shows a side, cross-sectional view of a semiconductor die package according to an embodiment of the invention.

FIG. 9 shows a semiconductor die package 10 comprising a leadframe structure 9 comprising a leadframe structure surface 9-1, and a semiconductor die 16 attached to the leadframe structure 9. The semiconductor die 16 comprises a first surface 16-1 comprising an input region (e.g., a source region) and a second surface 16-2 comprising an output region (e.g., a drain region). A molding material 14 covers at least a portion of the semiconductor die 16 and the leadframe structure 9. The molding material 14 exposes the second surface 16-2 of the semiconductor die 16 and also exposes the leadframe structure surface 9-1. An exterior surface 14-1 of the molding material 14 may be substantially coplanar with the second surface 16-2 of the semiconductor die 16.

The semiconductor die package 10 also includes a metallic housing structure 11 comprising a major portion 11(*a*) and a first leg 11(*b*) extending from the major portion 11(*a*) and a second leg 11(*c*) extending from the major portion 11(*a*). The first and second legs 11(*b*), 11(*c*) may be at opposite sides of the major portion 11(*a*). As shown in FIG. 9, the bottom surface 14-2 of the molding material 14, the bottom surface 9-1 of the leadframe structure 9, and the bottom surfaces of the legs 11(*b*), 11(*c*) may be substantially coplanar.

The metallic housing 11 is electrically and mechanically coupled to the output region at the second surface 16-2 of the semiconductor die 16. A first conductive adhesive 15 couples the major portion 11(*a*) of the metallic housing structure 11 and the second surface 16-2 of the semiconductor die 16. Second and third conductive adhesives 17, 18, electrically couple gate and source regions at the first surface 16-1 of the semiconductor die 16 to a source structure 13 and a gate structure 12 of the leadframe structure 9. The source structure 13 and the gate structure 12 of the leadframe structure 9 can respectively have a source lead structure surface 13-1 and a gate lead structure surface 12-1, which are defined by a partial etching process.

Each leg 11(*a*), 11(*b*) includes a sidewall (which may be solid and may extend at least as long as the side of the molding material 14) and a base portion, perpendicular to the sidewall, which will be coupled to a conductive land 4(*d*) of a circuit substrate 4. Gate structure surface 12-1 and source structure surface 13-1 can be correspondingly mounted on the pads 4(*s*) and 4(*g*). Together, the semiconductor die package 10 and the circuit substrate 4 may form an electrical assembly.

Although the metallic housing structure includes two legs, it may include three or even four legs in other embodiments of the invention. Also, the metallic housing structure may include any suitable thickness (e.g., less than about 1 mm).

As shown in FIG. 9, a sidewall of the molding material 14-1 is spaced from the walls that are part of the leg 11(b) and leg 11(c), thereby providing the legs 11(b), 11(c) with a greater heat dissipation surface area.

Figure 10A:
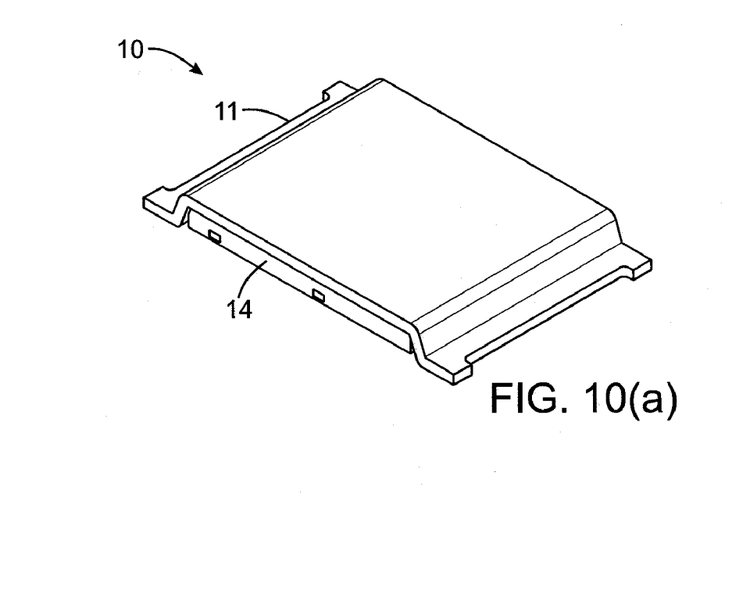
FIGS. 10(a)-10(b) respectively show top and bottom perspective views of another semiconductor die package embodiment.
Figure 10B:
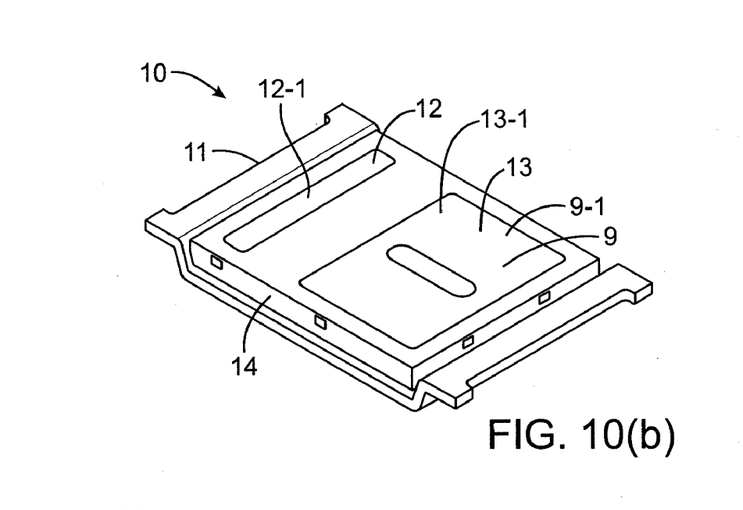

FIGS. 10(a)-10(b) respectively show top and bottom perspective views of another semiconductor die package embodiment.

Figure 11:
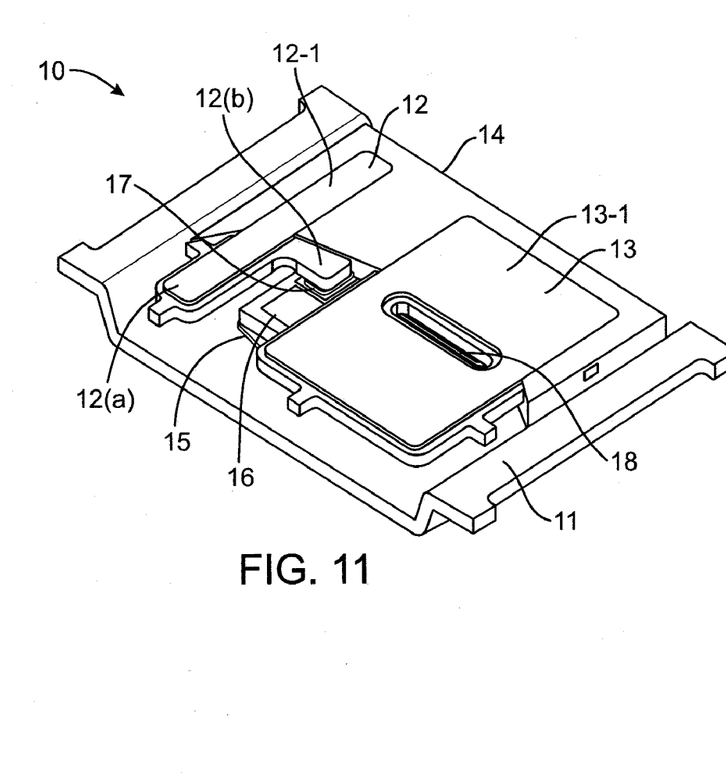
FIG. 11 shows a bottom perspective view of the semiconductor die package embodiment shown in FIGS. 10(a) and 10(b). Part of the molding material is removed.

FIG. 11 shows a bottom perspective view of the semiconductor die package embodiment shown in FIGS. 10(a) and 10(b). Part of the molding material is removed. As shown in FIG. 11, the source structure 12 includes an elongate portion 12-1 and a perpendicular portion 12(b), which has a surface that is in a slightly different plane than the gate structure surface 12-1. The perpendicular portion 12(b) is covered with a molding material 14. The drain structure also has a surface 13-1 that is defined by partial etching. FIG. 11 also shows an elongate aperture 18 in the source structure 13. The aperture 18 can serve as a mold locking feature and as a space for solder overflow.

FIGS. 12(a)-12(e) show precursors formed during the formation of a semiconductor die package.

Figure 12A:
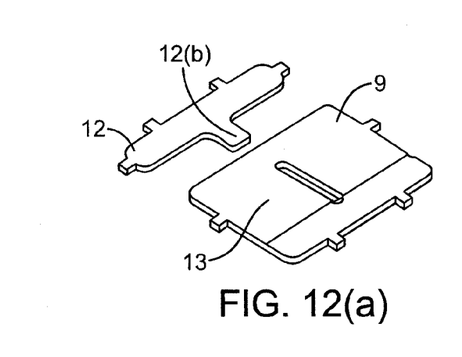
FIGS. 12(a)-12(e) show precursors formed during the formation of a semiconductor die package, and also an example of a semiconductor die package.

FIG. 12(a) shows a leadframe structure 9 after it has been sawn with a wafer saw. Although one leadframe structure 9 is shown, in other embodiments, the leadframe structure 9 may be in an array of leadframe structures during processing.

Figure 12B:
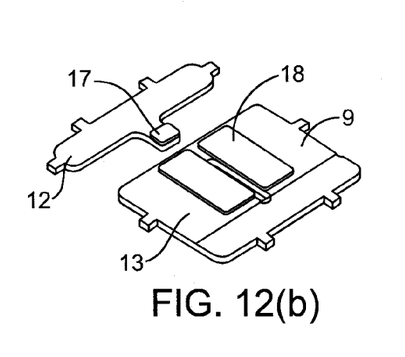

After the leadframe structure 9 is obtained, a conductive adhesive is deposited on the leadframe structure 9. FIG. 12(b) shows a leadframe structure 9 after second and third conductive adhesives 17, 18 are deposited on the leadframe structure 9.

Figure 12C:
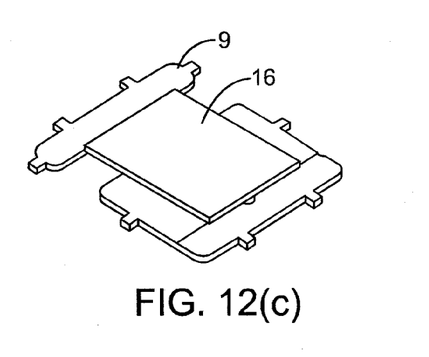

After the conductive adhesive is deposited on the leadframe structure 9, as shown in FIG. 12(c), a semiconductor die 16 is mounted on the leadframe structure 9 using a pick and place process, a flip-chip die attach process, etc. A conventional solder reflow process can also be performed at this time.

Figure 12D:
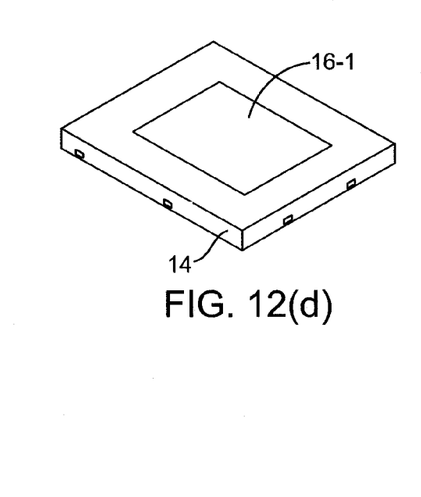

After the semiconductor die 16 is placed on the leadframe structure 9, as shown in FIG. 12(d), a molding material 14 is formed around the leadframe structure 9 and portions of the semiconductor die 16. The molding material 14 exposes the surface 16-1 of the semiconductor die 16. A molding process such as a tape assisted molding process may be used to mold the molding material 14. If desired, a package saw process can then be performed.

Figure 12E:
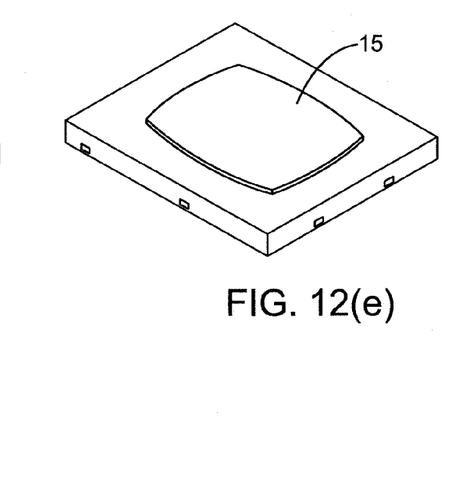

After the molding material 14 is molded, as shown in FIG. 12(e), the first conductive adhesive 15 is deposited on the exposed surface 16-1 of the semiconductor die 16. The first conductive adhesive 15 may have a lower reflow temperature than the second and third conductive adhesives 17, 18. After the first conductive adhesive is deposited on the exposed surface 16-1, a reflow process can be performed.

Figure 12F:
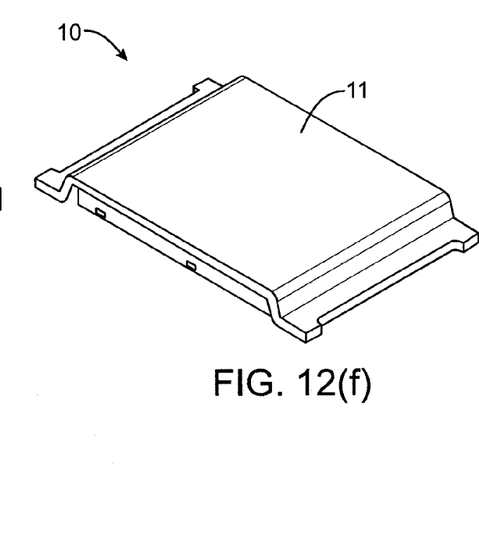
FIG. 12(f) shows an example of a semiconductor die package according to an embodiment of the invention.

After the first conductive adhesive 15 is deposited on the die surface 16-1, as shown in FIG. 12(f), a metallic housing structure 11 is placed on the first conductive adhesive 15 so that it is secured to the semiconductor die 16. A punch singulation process may also be performed.

FIGS. 13(a)-13(e) show precursors formed during the formation of a semiconductor die package.

Figure 13A:
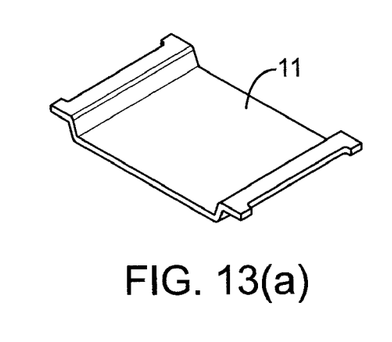
FIGS. 13(a)-13(e) show precursors formed during the formation of a semiconductor die package according to another embodiment of the invention.

FIG. 13(a) shows a metallic housing structure 11 after it has been sawn with a wafer saw.

Figure 13B:
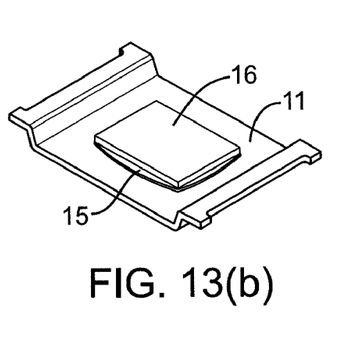

FIG. 13(b) shows the semiconductor die 16 mounted on the metallic housing structure 11 with a first conductive adhesive 15.

Figure 13C:
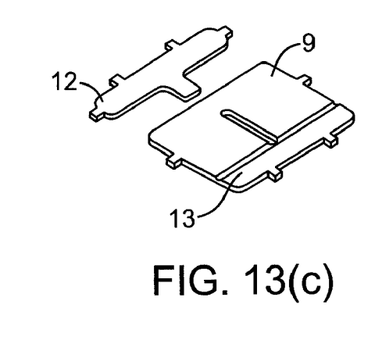

FIG. 13(c) shows a leadframe structure 9 after it has been sawn. As noted above, the leadframe structure 9 could alternatively be in an array during processing.

Figure 13D:
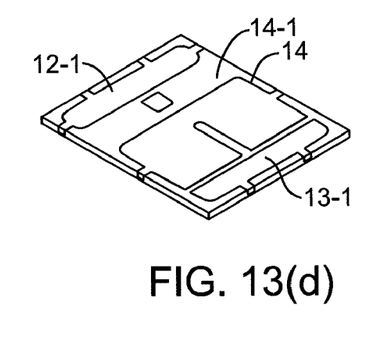

FIG. 13(d) shows a molding material 14 formed around the leadframe structure 9. As shown, surface 14-1 of the molding material 14 and the surface 12-1 of the gate structure and surface 13-1 of the source structure are substantially coplanar. After molding, a premolded substrate is thereafter formed.

Figure 13E:
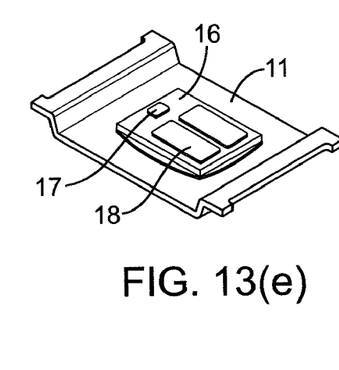

FIG. 13(e) shows second and third conductive adhesives 17, 18 being deposited on the semiconductor die 16.

Figure 13F:
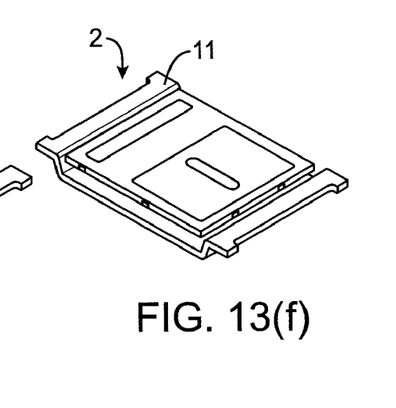
FIG. 13(f) shows an example of a semiconductor die package according to another embodiment of the invention.

Referring to FIG. 13(f), after the conductive adhesives 17, 18 are deposited on the semiconductor die 16, the premolded substrate is placed on the semiconductor die 16 to form the semiconductor die package 2. The semiconductor die package 2 differs from the semiconductor die package 10 shown in FIG. 12(f). In the semiconductor die package 2 in FIG. 13(f), the molding material 14 does not surround the edges of the semiconductor die 16, whereas it does in the semiconductor die package 10 in FIG. 12(f).

Figures 14A, 14B:
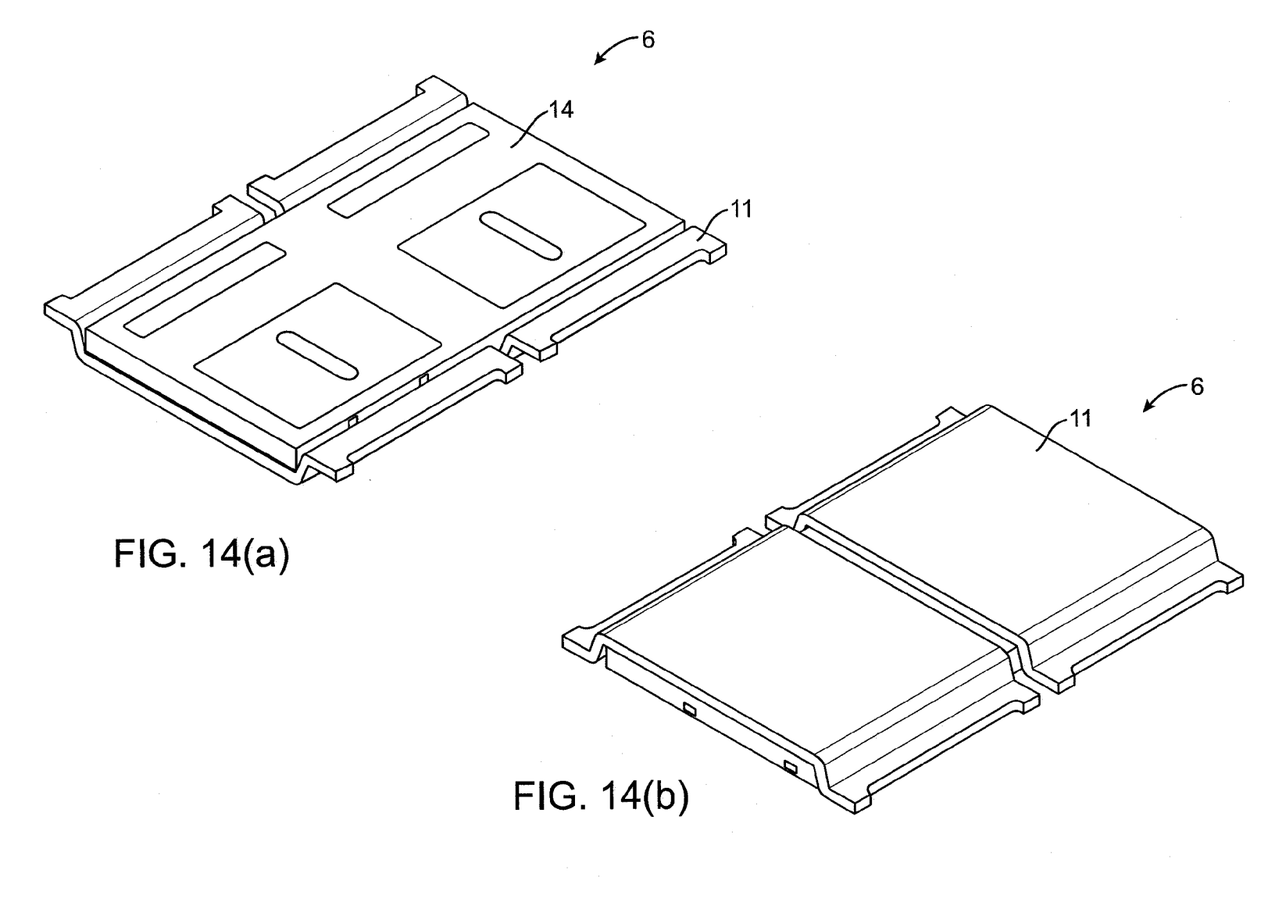
FIG. 14(a) shows a bottom perspective view of a semiconductor die package with two metallic housing structures.
FIG. 14(b) shows a top perspective view of a semiconductor die package with two metallic housing structures.

FIG. 14(a) shows a bottom perspective view of a semiconductor die package 6 with two metallic housings.

FIG. 14(b) shows a top perspective view of a semiconductor die package 6 with two metallic housings.

The embodiments including the metallic housing structure have a number of advantages. For example, they have good top and bottom cooling properties, and can also satisfy a standard industry land pattern on circuit substrates. The semiconductor dies are also protected from the environment through the use of a molding material.

Any of the above above-described semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention. For example, specific details regarding leadframe structures, conductive adhesives, and processing conditions associated with the above-described semiconductor die package including a premolded clip structure assembly may also be used in the semiconductor die packages including a metallic housing structure.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
   a premolded clip structure assembly comprising a clip structure, a semiconductor die attached to the clip structure, and a first molding material covering at least a portion of the clip structure and covering at least a portion of an edge of the semiconductor die;
   a leadframe structure comprising a die attach pad, wherein the leadframe structure is attached to premolded clip structure assembly; and
   a second molding material covering at least a portion of the leadframe structure and the premolded clip structure assembly; and wherein the first molding material contacts the second molding material, and wherein an interface exists between the first and second molding materials.

2. The semiconductor die package of claim 1 further comprising a conductive adhesive between the leadframe structure and the premolded clip structure assembly.

3. The semiconductor die package of claim 2 wherein the conductive adhesive is a first conductive adhesive and wherein the premolded clip structure assembly comprises a second conductive adhesive between the clip structure and the semiconductor die.

4. The semiconductor die package of claim 3 wherein the semiconductor die comprises a power semiconductor die comprising a power MOSFET.

5. The semiconductor die package of claim 3, wherein the first conductive adhesive comprises a first solder with a first melting temperature, and wherein the second conductive adhesive comprises a second solder with a second melting temperature that is greater than the first melting temperature.

6. The semiconductor die package of claim 1 wherein the premolded clip structure assembly comprises a first surface and a second surface opposite the first surface, wherein the first surface comprises a first molding material surface and a surface of the semiconductor die.

7. The semiconductor die package of claim 1 wherein the first molding material covers all edges of the semiconductor die.

8. The semiconductor die package of claim 1 wherein the semiconductor die is a first semiconductor die and the semiconductor die package comprises a second semiconductor die, wherein all of edges of the second semiconductor die are covered by the first molding material.

9. The semiconductor die package of claim 1 wherein the semiconductor die comprises a drain region, and wherein the clip structure is electrically coupled to the drain region of the semiconductor die.

10. The semiconductor die package of claim 9 wherein the first molding material covers all edges of the semiconductor die.

11. A semiconductor die package comprising:
a leadframe structure comprising a leadframe structure surface;
a semiconductor die attached to the leadframe structure, wherein the semiconductor die comprises a first surface comprising an input region and a second surface comprising an output region;
a molding material covering at least a portion of an edge of the semiconductor die and covering at least a portion of the leadframe structure, wherein the molding material exposes the second surface of the semiconductor die and also exposes the leadframe structure surface;
a metallic housing structure comprising a major portion and a first leg extending from the major portion and a second leg extending from the major portion opposite the first leg, wherein the metallic housing including the major portion, the first leg and the second leg is electrically and mechanically coupled to the output region at the second surface of the semiconductor die; and
a conductive adhesive coupling the major portion of the metallic housing structure and the second surface of the semiconductor die.

12. The semiconductor die package of claim 11 wherein the metallic housing structure comprises copper.

13. The semiconductor die package of claim 11 wherein the semiconductor die comprises a power MOSFET.

14. The semiconductor die package of claim 11 wherein molding material is spaced from the first and second legs.

15. The semiconductor die package of claim 11 wherein the metallic housing structure is a single unitary body.

16. The semiconductor die package of claim 11 wherein the major portion, the first leg and the second leg comprise copper.

17. The semiconductor die package of claim 11 further comprising a conductive adhesive, wherein the major portion is coupled to the output region using the conductive adhesive.

* * * * *